United States Patent [19]

Gandolfi et al.

[11] 4,126,931
[45] Nov. 28, 1978

[54] METHOD OF PASSIVATING HIGH-VOLTAGE POWER SEMICONDUCTOR DEVICES

[75] Inventors: Luciano Gandolfi; Rudolf Rocak, both of Milan, Italy

[73] Assignee: SGS-ATES Componenti Elettronici S.p.A., Milan, Italy

[21] Appl. No.: 786,385

[22] Filed: Apr. 11, 1977

[30] Foreign Application Priority Data

Apr. 14, 1976 [IT] Italy .............................. 22280 A/76

[51] Int. Cl.$^2$ ............................................ B01J 17/00
[52] U.S. Cl. ...................................... 29/578; 29/579; 29/580; 96/36; 156/659
[58] Field of Search ..................... 29/580, 578, 579; 96/36; 156/659

[56] References Cited

U.S. PATENT DOCUMENTS

| 3,432,919 | 3/1969 | Rosvold | 29/580 |
| 3,895,429 | 7/1975 | Huang | 29/580 |
| 4,037,306 | 7/1977 | Gutteridge | 29/580 |

Primary Examiner—W. Tupman
Attorney, Agent, or Firm—Karl F. Ross

[57] ABSTRACT

Several junction-type semiconductor chips, specifically NPN transistors, are simultaneously produced by mesa technique from a semiconductor wafer by adhering to one major surface thereo a supporting structure including a bonding layer of wax, similarly adhering a protective layer of a relatively soft material — likewise a wax — to the opposite major wafer surface, and dividing the wafer into chips temporarily held together by the supporting structure. The last-mentioned step involves a splitting of the protective layer into isolated sections by making incisions in that layer cutting into the underlying wafer body, followed by an erosion of the semiconductor material of that body by an etching solution to form channels which extend completely across the wafer and terminate at the supporting structure, these channels being widened in the immediate vicinity of the protective layer to form undercuts. A continuous passivating film is applied, e.g. by vapor deposition, to the channel walls and to the several isolated sections of the protective wax layer adhering to the exposed chip faces, the film enveloping projecting edge portions of these sections which extend partly across the channel entrances. After these edge portions are mechanically cut off, film segments adhering to the isolated wax-layer sections can be removed by dissolving the wax; concurrent dissolution of the bonding layer of the supporting structure removes that structure from the chips which then remain interconnected only by parts of the passivating film bridging the lateral channel walls.

7 Claims, 7 Drawing Figures

METHOD OF PASSIVATING HIGH-VOLTAGE POWER SEMICONDUCTOR DEVICES

FIELD OF THE INVENTION

The present invention relates to the manufacture of junction semiconductor devices, and in particular to a method of passivating in a single operation the junctions of a multiplicity of semiconducting elements.

BACKGROUND OF THE INVENTION

The "mesa" technique is already known in the production of power semiconductor devices having junctions adapted to withstand very high reverse bias. In this technique, a wafer of semiconductor material, usually silicon or germanium in a microcrystalline state, after having been treated with conventional diffusion and photoengraving techniques to form one or more junctions parallel to its faces, is subjected to an etching operation according to a predetermined pattern. The etched areas divide the wafer into a plurality of semiconducting elements or chips which have lateral surfaces intersecting one or more junctions between zones of opposite conductivity types. The slope of the chip flanks is determined during the design of the device in accordance with the principle of minimizing the electrostatic fields which, owing to the difference in polarity and resistivity of the semiconductor layers, are formed on the lateral surface of each semiconducting element. The bevel or inclination of any flank is usually termed positive when, considering two superimposed layers having different resistivity and forming a junction near a face of the mesa, the outer layer of lower resistivity projects beyond the inner layer of higher resistivity, and negative (standard mesa) when the higher-resistivity inner layer projects beyond the outer layer of lower resistivity.

It is known that the electrical properties of the semiconductor devices can be affected by even small amounts of impurities deposited on the surfaces of the semiconductor material when the surfaces remain uncovered during the various operational processing steps, and thus in direct contact with ambient air or other substances. Particularly sensitive to contamination are the zones immediately adjacent to the junctions which, in the case of devices manufactured in accordance with the "mesa" technique, are exposed at the lateral surfaces of each semiconducting element. This problem requires a great deal of care especially when junctions withstanding reverse voltages higher than 1000 volts are to be produced. In that case, it is necessary to provide working conditions characterized by meticulous cleanliness throughout the successive operations following the engraving operation, while taking care that the wafers should be manipulated to the smallest possible extent until they are mounted on their supports and passivated, i.e. completely insulated from the effects of any foreign contaminating agent by being clad in suitable protective materials.

Manufacturing costs for high-reverse-bias devices, already large owing to the specific measures required in handling wafers with unprotected junctions, are further increased by the impossibility of testing the individual semiconducting elements on the still uncut wafer, e.g. by using suitable automatic measuring apparatus, since passivation of the lateral surfaces is a determining factor for the purposes of measuring maximum reverse-bias values to which the junctions may be subjected. Consequently, the overall cost of the finished product is relatively high because elements with pre-existing faults, due to inevitable defects in the crystalline structure of the starting material, or possibly damaged in the various working steps can be rejected only after assembly in the final test.

To avoid the above-described disadvantages, it is necessary to effect passivation immediately after the engraving operation. In this way not only the risk of surface contamination is reduced to a minimum but it is also possible to test the entire wafer, thereby considerably reducing waste of material and labor.

According to a known method of passivating in a single operation all the semiconducting elements in a wafer of semiconductor material, the wafer is fixed at one face thereof to a metallic substrate by means of an electrically conductive adhesive. The wafer is then subdivided into chips without detaching it from the substrate and is thereafter subjected to glass deposition by electrophoresis, whereby the lateral surfaces or flanks of the chips and the parts of the substrate between adjacent chips are covered by a glass layer. This method has some drawbacks which make it difficult to carry it out. In the first place, the adhesive used for fixing the wafer to the substrate can contaminate the chips because it is electrically conductive. In practice, moreover, such adhesives are rarely effective enough to prevent the chips from being prematurely detached during the mechanical cutting of the wafer. Furthermore, the parts of the metallic substrate which remain free after subdivision are covered by a glass layer which is thicker than that covering the lateral parts of the chips, and thus subsequent separation of the chips is rather critical since there is a great risk of cracking, during this operation, the glass covering the junctions, thereby giving access to contaminating agents.

OBJECT OF THE INVENTION

It is the object of the present invention to provide a more efficient method of passivating simultaneously the exposed flanks of all the semiconductor elements of a wafer, which avoids the drawbacks of the known method described above and affords very effective protection against contaminating agents with the use of an extremely pure organic passivating substance.

SUMMARY OF THE INVENTION

We realize this object, in accordance with our present invention, by forming a wafer of semiconductor material with a plurality of crystalline layers of different conductivity types separated by junctions which are substantially parallel to the major wafer surfaces, coating one of these surfaces with a protective layer of a relatively soft shielding material and adhering a supporting structure to the opposite surface. We then subdivide the wafer into a plurality of independent chips by forming channels which cut across the protective layer and across the wafer while terminating at the supporting structure whereby that layer is divided into isolated sections; the chips, however, are temporarily held together by the supporting structure. The channels are widened within the wafer to form undercuts in the immediate vicinity of the protective layer whose isolated sections are thereby provided with projecting edge portions extending partly across the adjacent channels. Next, we apply a continuous passivating film substantially uniformly to the channel walls and to the isolated protective-layer sections, parts of that film enveloping the projecting edge portions thereof. By mechanically removing these edge portions together with the enveloping film parts, we sever film segments adhering to the isolated layer sections from the remainder of the passivating film overlying the channel walls. This facilitates the subsequent removal of the isolated layer sections and the adhering film segments without impairing the bond between the remainder of the passivating film and the chip flanks constituting the lateral channel walls.

According to a more particular feature of our invention, the protective layer is made from a material — preferably a wax — which is removable by a solvent at a temperature low enough to leave the remainder of the passivating film (overlying the channel walls) intact. Advantageously, the supporting structure is adhered to the opposite wafer surface by a bonding layer, forming part of that structure, of substantially the same type of material as the protective layer so that the two layers can be dissolved simultaneously, leaving the chips interconnected only by parts of the passivating film which bridge the lateral walls of the intervening channels.

BRIEF DESCRIPTION OF THE DRAWING

The above and other features of our invention will now be described in detail with reference to the accompanying drawing wherein.

SPECIFIC DESCRIPTION

Figure 1:
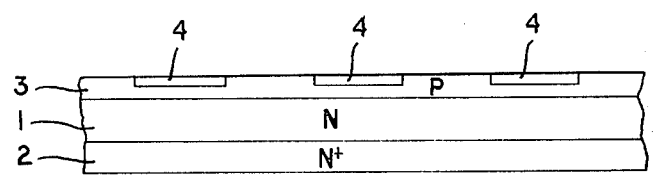
FIGS. 1–7 are sectional views showing, on an enlarged scale, a portion of a semiconductor wafer in successive steps of manufacture of a number of junction-type semiconductor devices pursuant to our invention.

In the illustrated embodiment the starting material is a wafer of monocrystalline silicon, doped with N-type impurities which is processed by conventional diffusion, masking and photoengraving operations so as to yield the structure illustrated in FIG. 1. This structure comprises a crystalline layer 1, whose N-type conductivity has remained the same as that of the starting material, and a crystalline layer 2 of $N^+$ conductivity obtained by diffusing into the wafer additional N-type impurities, e.g. phosphorus. The $N^+$ layer has the function of creating a zone of relatively low resistivity at the collectors of a number of individual NPN transistors to be obtained from the wafer and its thickness is determined on the basis of design considerations concerning mainly the collector-emitter saturation voltage $V_{CE}$sat.

Subsequently, to form the bases of the transistors, a P-type impurity, e.g. boron, is diffused in high concentration onto the face of the wafer opposite the $N^+$ layer 2. A crystalline P layer 3 is thus obtained which has a resistivity lower than that of the N layer 1 disposed below it. The diffusion depth is adjusted so that the distance between the outer collector layer 2 and the base layer 3 is sufficient to withstand the required reverse collector voltage and penetration of the corresponding space charge into the inner collector layer 1, while avoiding both excessive increase in the voltage $V_{CE}$sat and excessive reduction in the maximum collector current of the transistors thus obtained.

The drawing shows several emitter zones 4 of the individual transistors. These zones are obtained by diffusing N-type impurities in predetermined zones of the surface of the layer 3 by using conventional masking and diffusion techniques. The distance between adjacent emitter zones depends on the dimensions and current characteristics of the transistors to be formed from the silicon wafer. Once the structure shown in FIG. 1 has been produced in the described manner, we proceed to the formation of the metallic contact zones for the terminals of the transistors on both faces of the wafer. For simplicity's sake such zones have not been illustrated.

The successive working steps relate specifically to the provision of a supporting substrate for the wafer, subdivision of the wafer into chips, and passivation of the individual chips in accordance with our present invention.

Figure 2:
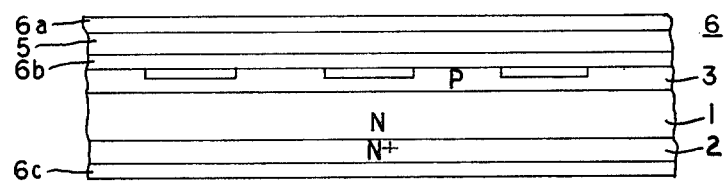
Figure 3:
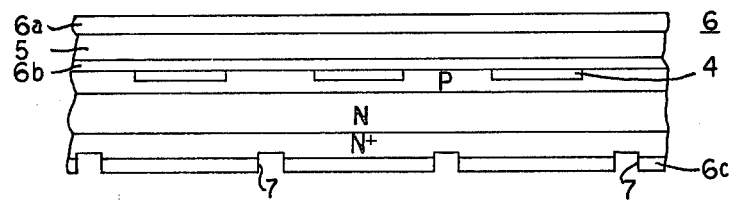

In the first step, the wafer is covered on both faces thereof with a layer of a material adapted to effectively shield the surfaces of the wafer from acids which will be subsequently used for etching the silicon. A suitable shielding material is a mixture of carnauba wax and paraffin (for simplicity this material is termed wax below). A stacked structure 6 (FIGS. 2 and 3) comprising two wax layers 6a, 6b bracketing a support film 5, e.g. filter paper, is prepared separately. The stack is then applied to the upper face of the wafer, which has the emitter zones 4, by causing first adhesion and then fusion and resolidification of the wax layers 6a and 6b. The function of stack 6 is to permit subdivision of the wafer while maintaining the relative position of the chips unaltered, and to protect the upper surface of the transistors constituted by the chips. The bottom of the wafer, i.e. the side opposite that covered by the supporting structure, is also covered with a wax layer 6c and is then mechanically cut to delimit the individual chips, as shown in FIG. 3. The cuts in the bottom of the wafer, dividing the layer 6c into isolated sections, define a network of channels or grooves 7 whose depth extends throughout the wax layer 6c and which penetrate to a small extent into the silicon surface.

Figure 4:
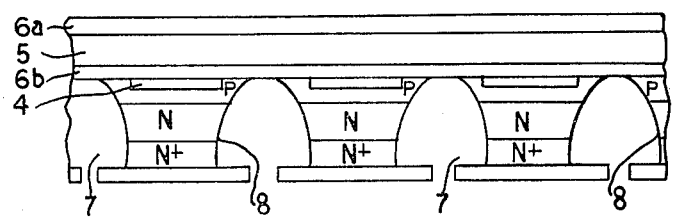

The wafer is then subjected to etching, as by using a solution of nitric, hydrofluoric and acetic acids, so as gradually to deepen the channels 7. Etching continues until the individual semiconducting chips are completely separated from one another, thereby forming as many individual transistors spaced from one another as shown in FIG. 4. The chips keep their mutual position owing to the supporting structure 6 to which they adhere. As is known, the erosive action of the acids is also effective above the protective layer 6c to form undercuts that are partially closed by that protective layer and have inclined flanks 8. As mentioned above, the inclination of the lateral surfaces or flanks 8 influences the electrical characteristics of the transistors. In the case of the high-voltage power transistors envisaged in of this application of the method according to our invention, the inclination is projected in the design of the device so as to maximize the collector reverse-bias voltage and minimize electrostatic fields on the lateral surfaces by taking into account the charge concentrations and the thicknesses of the various layers of the semiconductor structure. By varying the composition and/or the concentration of the acidic etching solution, it is possible to obtain inclined surfaces in accordance with optimum design values.

While we have described the use of etching to form the lateral surfaces of the semiconductors to be produced in accordance with our invention, the same or a similar result could be obtained by mechanical engraving instead of etching, or in combination therewith.

Figure 5:
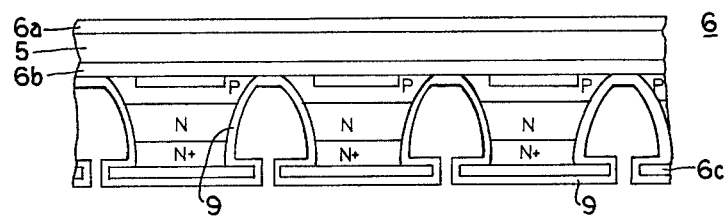

The groove walls forming the lateral surfaces of the chips are passivated by being covered with a thin and uniform layer 9 consisting of an insulating organic substance of high purity (FIG. 5). We prefer to employ for this purpose a polymer available under the trademark "Parylene" which can be used at ambient temperature. In particular, the method of applying a thin layer of Parylene comprises heating a solid dimer under vacuum to obtain a gaseous double radical. When the molecules of the double radical are deposited on the cold surface of the wafer, they combine to form a solid polymer of high molecular weight. A complete and uniform covering of the surface subjected to the treatment is thus achieved thanks to the ability of the vapor to penetrate into each recess in the surface. The coating thus obtained is nonporous and is extremely pure because it is derived from a single starting material. This latter characteristic is very important for passivating the lateral surfaces of the chips since it eliminates the risk of surface contamination due to the passivating material itself which could impair the realization of the electrical characteristics required in the transistor, especially the possibility of attaining high reverse collector voltages.

Figure 6:
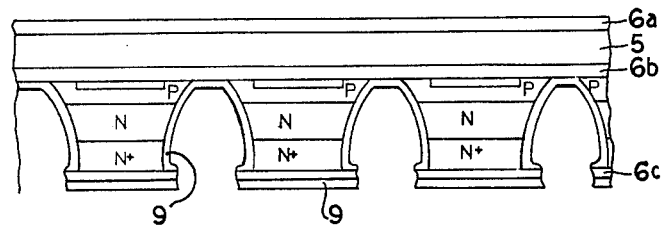
Figure 7:
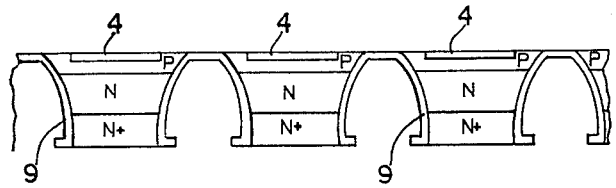

According to an important feature of our invention, the edge portions of the protective layer 6c projecting beyond the grooves or incisions 7 as a consequence of the undercutting, enveloped by parts of the continuous passivating layer or film 9 of Parylene, are removed by a suitable mechanical procedure, as by using conventional engraving and cutting apparatus, thereby obtaining the structure illustrated in FIG. 6. Next, the wax layers 6a, 6b are removed by means of a suitable solvent, along with the isolated sections of layer 6c still adhering to the several collector zones carved out from layer 2. Together with the bonding layers 6a, 6c there are also removed the layer of filter paper 5 and the segments of Parylene film 9 formed on the isolated sections of wax layer 6c. The chips remain united by parts of the Parylene layer formed on the bottom of the grooves so as to bridge opposite walls thereof, as shown in FIG. 7, and the transistors bounded by these grooves can be subjected to automatic or manual measurement of all their electrical parameters.

The subsequent operations comprising separation of the chips and their mounting in suitable containers are not described in detail here since they do not form part of our present invention. It should be noted, however, that in order to bond the chips to their respective substrates use must be made of low-melting alloys of the type usually adopted in the manufacture of power devices since at high temperatures the chemical and physical characteristics of the Parylene layer could be adversely affected.

The invention has been described with reference to its application to "mesa"-type transistors having positive bevel, but it should be understood that it could be used in the same way in the manufacture of "mesa"-type transistors having a negative bevel. In that case the upper face of the wafer instead of the lower face would be etched, with interchange of the positions of the supporting structure 6 and the wax layer 6c.

Although only one embodiment of the invention has been described and illustrated, many variants and modifications may be made within its scope. Thus, for example, the metallic zones for the contacts of the transistor terminals could be formed after passivation by using procedures and alloys which do not involve temperatures liable to damage the Parylene layer. Furthermore, during passivation, instead of the thin Parylene layer obtained by evaporation under vacuum, a suitable plastic material such as polytetrafluorethylene could be deposited on the bottom of the wafer and in the grooves by means of an ion-sputtering process.

We claim:

1. A method of making junction-type semiconductor devices, comprising the steps of:
   providing a wafer of semiconductor material having a pair of substantially parallel major surfaces;
   forming a plurality of crystalline layers of different conductivity types in said wafer, said crystalline layers being separated by junctions substantially paralleling said major surfaces;
   coating one of said major surfaces with a protective layer of a shielding material softer than said semiconductor material;
   adhering a supporting structure to said wafer at the other of said major surfaces;
   subdividing said wafer into a plurality of independent chips by forming channels which cut across said protective layer and said wafer while terminating at said supporting structure whereby the latter holds said chips together, and widening said channels within said wafer to form undercuts in the immediate vicinity of said protective layer which is thereby split into isolated sections with projecting edge portions extending partly across said channels;
   applying a continuous passivating film substantially uniformly to the walls of said channels and to said isolated sections including said edge portions;
   mechanically removing said edge portions together with parts of said passivating film enveloping same, thereby severing film segments adhering to said isolated sections from the remainder of said passivating film overlying the channel walls; and
   removing said isolated sections of said protective layer together with the adhering film segments from said chips.

2. A method as defined in claim 1 wherein the removal of said isolated sections and film segments is accompanied by a removal of said supporting structure, with said chips left interconnected by parts of said passivating film bridging opposite channel walls.

3. A method as defined in claim 2 wherein said supporting structure includes a bonding layer adhering to said other of said surfaces, the removal of said supporting structure and of said film segments being accomplished by dissolving said bonding layer and said isolated sections at a temperature low enough to leave said remainder of said passivating film intact.

4. A method as defined in claim 3 wherein said bonding layer and said protective layer are made of wax.

5. A method as defined in claim 1 wherein the forming and widening of said channels comprises a mechanical cutting of said protective layer with an incision extending partly into said wafer, followed by an erosion of semiconductor material by an etching agent incapable of attacking said protective layer.

6. A method as defined in claim 1 wherein said passivating film is formed by vapor-depositing an organic substance, capable of polymerizing at ambient temperature, on said isolated sections and channel walls.

7. A semiconductor device produced by the method defined in claim 1.

* * * * *